United States Patent
Kern et al.

(10) Patent No.: US 11,262,948 B2
(45) Date of Patent: Mar. 1, 2022

(54) TRANSFORMATION OF BINARY SIGNALS READ FROM A MEMORY

(71) Applicant: Infineon Technologies AG, Neubiberg (DE)

(72) Inventors: Thomas Kern, Aschheim (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/820,784

(22) Filed: Mar. 17, 2020

(65) Prior Publication Data
US 2020/0301614 A1 Sep. 24, 2020

(30) Foreign Application Priority Data
Mar. 20, 2019 (DE) .......................... 102019107139.9

(51) Int. Cl.
*G06F 3/06* (2006.01)
*G11C 11/56* (2006.01)

(52) U.S. Cl.
CPC .......... *G06F 3/0659* (2013.01); *G06F 3/0604* (2013.01); *G06F 3/0673* (2013.01); *G11C 11/56* (2013.01)

(58) Field of Classification Search
CPC .... G06F 3/0659; G06F 3/0673; G06F 3/0604; G11C 11/56; G11C 11/5642; G11C 16/26; G11C 16/32; G11C 17/18; G11C 13/0061; G11C 11/1693; G11C 11/1675; G11C 13/004; G11C 7/1006
USPC ........................................................ 711/154
See application file for complete search history.

(56) References Cited

U.S. PATENT DOCUMENTS

| | | | |
|---|---|---|---|
| 9,805,771 B2 | 10/2017 | Loibl | |
| 10,623,026 B2* | 4/2020 | Kern | H03M 13/1575 |
| 2010/0281340 A1* | 11/2010 | Franceschini | G11C 16/349 714/763 |
| 2012/0026783 A1* | 2/2012 | Jung | G11C 11/1675 365/158 |
| 2015/0243333 A1 | 2/2015 | Loibl | |
| 2020/0005873 A1* | 1/2020 | Yazovitsky | G11C 16/349 |
| 2021/0096757 A1* | 4/2021 | Winarski | G06F 9/546 |
| 2021/0096774 A1* | 4/2021 | Han | G06F 12/10 |

* cited by examiner

*Primary Examiner* — Fernando Hidalgo
(74) *Attorney, Agent, or Firm* — Eschweiler & Potashnik, LLC

(57) ABSTRACT

What is specified is a method for transforming a first binary signal read from a memory, wherein the first binary signal is transformed into a second binary signal provided that the first binary signal is a code word or a predefined code word of a k-out-of-n code, wherein the first binary signal is transformed into a predefined signal provided that the first binary signal is not a code word or is not a predefined code word of the k-out-of-n code, wherein the predefined signal is different than the second binary signal. A corresponding device is furthermore specified.

18 Claims, 14 Drawing Sheets

Fig.2

| Cell$_0$ | Cell$_1$ | Cell$_2$ | Cell$_3$ | Cell$_4$ | Cell$_5$ |
|---|---|---|---|---|---|
| HRS | HRS | HRS | LRS | LRS | LRS |
| HRS | HRS | LRS | HRS | LRS | LRS |
| HRS | LRS | HRS | HRS | LRS | LRS |
| LRS | HRS | HRS | HRS | LRS | LRS |
| HRS | HRS | LRS | LRS | HRS | LRS |
| HRS | LRS | HRS | LRS | HRS | LRS |
| ... | | | | | |
| LRS | LRS | HRS | LRS | HRS | HRS |
| LRS | LRS | LRS | HRS | HRS | HRS |

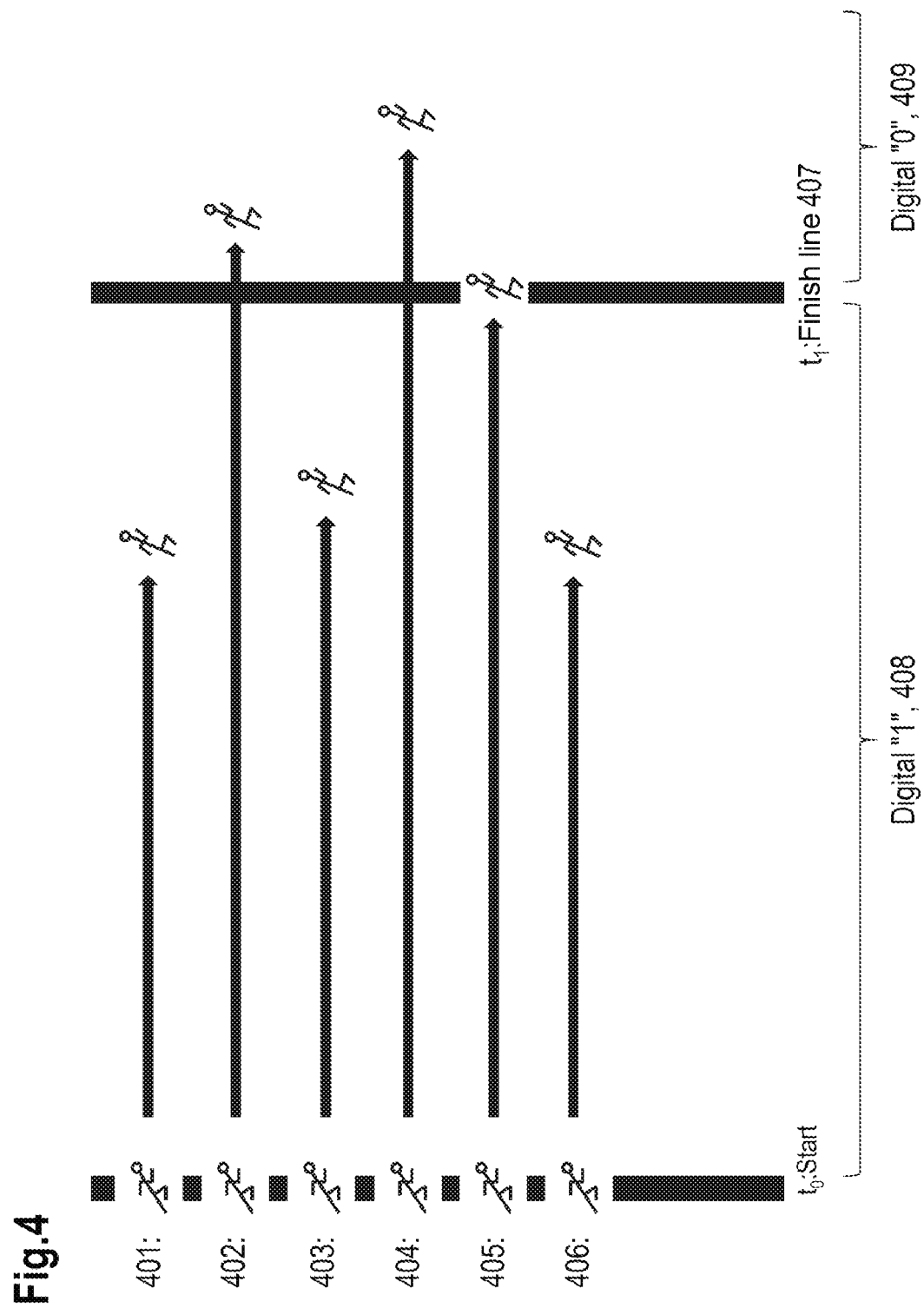

Fig.13

| Bit position 0 | State A |
| --- | --- |
| Bit position 1 | State A |
| Bit position 2 | State B |
| Bit position 3 | State C |
| Bit position 4 | State B |
| Bit position 5 | State C |

Fig.14

| States | Output of the logic circuit 905 |
|---|---|
| AABBCC | 000000 |
| AABCBC | 000001 |
| AABCCB | 000010 |
| AACCBB | 000011 |
| AACBCB | 000100 |
| AACBBC | 000101 |
| BBAACC | 000110 |
| BBACAC | 000111 |
| BBACCA | 001000 |
| BBCCAA | 001001 |
| BBCACA | 001010 |
| BBCAAC | 001011 |
| CCAABB | 001100 |
| CCABAB | 001101 |
| CCABBA | 001110 |
| CCBBAA | 001111 |
| CCBABA | 010000 |
| CBCBAA | 010001 |
| ABABCC | 010010 |
| ABACBC | 010011 |
| ABACCB | 010100 |
| ABBACC | 010101 |
| ABBCAC | 010110 |
| ABBCCA | 010111 |
| ABCABC | 011000 |
| ABCBAC | 011001 |
| ABCBAC | 011010 |
| ABCCAB | 011011 |
| ABCCBA | 011100 |
| ABCBCA | 011101 |
| ACABBC | 011110 |
| ACABCB | 011111 |

| States | Output of the logic circuit 905 |
|---|---|
| ACACBB | 100000 |
| ACBABC | 100001 |
| ACBACB | 100010 |
| ACBBAC | 100011 |
| ACBBCA | 100100 |
| ACBCAB | 100101 |
| ACBCBA | 100110 |
| ACCABB | 100111 |
| ACCBAB | 101000 |
| ACCBBA | 101001 |
| BAABCC | 101010 |
| BAACBC | 101011 |
| BAACCB | 101100 |
| BABACC | 101101 |
| BABCAC | 101110 |
| BABCCA | 101111 |
| BACACB | 110000 |
| BACACB | 110001 |
| BACBCA | 110010 |
| BACCAB | 110011 |
| BACCBA | 110100 |
| BCAABC | 110101 |
| BCAACB | 110110 |
| BCAABC | 110111 |
| BCABCA | 111000 |
| BCABCA | 111001 |
| BCACAB | 111010 |
| BCACBA | 111011 |
| BCBAAC | 111100 |
| BCBACA | 111101 |
| BCBCAA | 111110 |
| BCCAAB | 111111 |

TRANSFORMATION OF BINARY SIGNALS READ FROM A MEMORY

REFERENCE TO RELATED APPLICATION

This application claims priority to German Application No. 10 2019 107 139.9, filed on Mar. 20, 2019, the contents of which are hereby incorporated by reference in their entirety.

FIELD

The disclosure relates to the transformation of binary signals read from a memory.

BACKGROUND

U.S. Pat. No. 9,805,771 B2 discloses the evaluation of states which are read from memory cells to transform them into the time domain and to utilize states arriving earlier in time accordingly for efficient read-out of memory cells.

SUMMARY

The present disclosure improves existing solutions and provides an efficient approach for transforming binary signals read from a memory.

A method is proposed for transforming a first binary signal read from a memory,
wherein the first binary signal is transformed into a second binary signal when the first binary signal is a code word or a predefined code word of a k-out-of-n code,
wherein the first binary signal is transformed into a predefined signal when the first binary signal is not a code word or is not a predefined code word of the k-out-of-n code.

The predefined signal is different than the second binary signal.

The transformation can be realized for example by means of a logic circuit and/or a table.

In one embodiment the following can hold true: $1 \leq k \leq n$, wherein n and k are positive integers.

In one embodiment, there is a (dedicated) second binary signal for each predefined code word of the k-out-of-n code.

By way of example, in the error-free case, the first signals are predefined code words of the k-out-of-n code. If a predefined code word is thus detected, then the first binary signal is transformed into the second binary signal.

The first binary signal can be transformed into the predefined signal, wherein the predefined signal can comprise a validity signal (e.g. in the form of a validity bit) (the predefined signal can also be a validity signal). The validity signal can thus indicate that the first binary signal is not a code word or is not a predefined code word of the k-out-of-n code. Such a validity signal can optionally also indicate that the second binary signal is valid because the first binary signal is a code word or a predefined code word of the k-out-of-n code.

There are a number of possibilities appertaining to the fact that transformation into the second signal is not effected, rather instead the predefined signal is provided:
The first binary signal is a code word of the k-out-of-n code, but for this very code word there is no appropriate second binary signal.
The first binary signal is not a code word of the k-out-of-n code.

Consequently, the case where the amount of code words of the k-out-of-n code is greater than the amount of value combinations possible by means of the second signal is also covered. By way of example, a 3-out-of-6 code comprises 20 code words, which, in accordance with the transformation, can also be mapped onto 4 bits and thus 16 possible values by virtue of 4 code words remaining unused and these 4 code words being transformed into the predefined signal in accordance with the above specification.

It should be noted here that the term "code word" denotes a valid allocation of bits in accordance with the predefined code. The code word thus fulfills the properties of a code. This correspondingly applies to different code words of different codes.

Further explanation is given below of how the states are determined in the time domain. Supplementary, in this regard, reference may also be made to U.S. Pat. No. 9,805,771 B2. As a result of transforming the variables to be detected into the time domain, the individual states occur successively in time. By way of example, 0-states occur before the 1-states (the designations 0-state and 1-state have been chosen by way of example for illustration purposes). Consequently, after the arrival of the k 0-states, the determination of the n states can be ended and the value 1 can be assigned to the n–k remaining states (there is no need to wait until the 1-states have been determined because, on account of the k-out-of-n code, there are k 0-states and (n–k) 1-states).

In one embodiment, the first binary signal is read from n memory cells of the memory.

In one embodiment, a memory cell of the memory can assume two or more states.

In one embodiment, the predefined signal comprises at least one of the following possibilities:
a predefined bit sequence,
a predefined bit sequence having a validity signal, for example, a validity bit, and
a predefined bit sequence having the same number of digits as the second binary signal.

In this case, it should be noted that the validity signal can be a binary signal or an analog signal or can comprise at least one binary and/or at least one analog signal.

In one embodiment,
the first binary signal has n binary values, and
the second binary signal has a number of binary values which is less than or equal to n.

In one embodiment, the second binary signal or the predefined signal is stored in an arrangement of latches, wherein the number of latches corresponds to the number of binary values of the second binary signal.

By way of example, a signal for freezing the latch (hold signal of the latch) can be determined solely from the value present at the data input of said latch. Consequently, directly and without significant delay, the latch can react and freeze the signal present at its data input.

In one embodiment,
the first binary signal and the second binary signal each have n binary values, and
the first binary signal is transformed into the second binary signal, wherein the first and second binary signals are identical provided that the first binary signal is a code word or a predefined code word of the k-out-of-n code.

In one embodiment,
in each case n states are read from memory cells of a memory, and the k fastest states or the (n-k) fastest states of the first binary signal are determined in a time domain.

In one embodiment, the fastest states are 0-states.

Alternatively, it is also possible that, on account of the assignment of physical specifications to states, the fastest states are 1-states.

In one embodiment, the remaining states that do not belong to the fastest states are correspondingly set.

If the fastest states are 0-states, then after determining the k-th 0-state, those (n–k) states for which an assignment has not yet been effected can be set as 1-states.

In one embodiment, the memory comprises at least one of the following memories:
   Floating gate cells;
   PCRAM,
   RRAM,
   MRAM,
   MONOS components,
   Nanocrystal cells, and
   ROM.

Moreover, a device is proposed for transforming a first binary signal read from a memory, comprising a processing circuit.

The processing circuit is configured to transform the first binary signal into a second binary signal provided that the first binary signal is a code word or a predefined code word of a k-out-of-n code.

The processing circuit is further configured to transform the first binary signal into a predefined signal provided that the first binary signal is not a code word or is not a predefined code word of the k-out-of-n code.

The predefined signal is different than the second binary signal.

In one embodiment, the method is carried out by a processing unit arranged functionally between the memory and an error processing facility coupled to a system bus.

In this case, the processing circuit can comprise software, hardware or mixed forms (firmware).

The device can be embodied in one component or in a distributed fashion in a plurality of components. Moreover, the processing circuit can comprise the error processing facility or be embodied separately from the latter. The memory can be part of the device or be embodied separately from the latter.

The processing circuit mentioned here can be embodied in particular as a processor unit and/or an at least partly hardwired or logic circuit arrangement, which is configured for example in such a way that the method as described herein is implementable. Said processing circuit can be or comprise any type of processor or computer with correspondingly required peripherals (memories, input/output interfaces, input-output devices, etc.).

The above explanations concerning the method are correspondingly applicable to the device.

In one embodiment the device furthermore comprises an arrangement of latches,
   wherein the second binary signal or the predefined signal is stored in the arrangement of latches, wherein the number of latches corresponds to the number of binary values of the second binary signal.

Moreover, a system is specified comprising at least one device described herein.

Furthermore, a computer program product is proposed which is loadable directly into a memory of a digital computer, comprising program code parts suitable for carrying out steps of the method described herein.

Moreover, a non-transitory computer-readable storage medium is specified, comprising computer-executable instructions suitable for the computer to carry out steps of the method described herein.

The above-described properties, features and advantages and the way in which they are achieved are explained further in association with the following schematic description of example embodiments which are explained in greater detail in association with the drawings. In this case, identical or identically acting elements may be provided with identical reference signs for the sake of clarity.

BRIEF DESCRIPTION OF THE DRAWINGS

FIG. 2 shows a table illustrating how 20 different states are represented on the basis of 6 memory cells $Cell_0$ to $Cell_5$;

FIG. 4 shows a diagram illustrating by way of example the temporal measurement of the states "0" and "1" from memory cells;

FIG. 13 shows an example allocation of six memory cells, wherein each memory cell can have one of the states A, B or C;

FIG. 14 shows a table showing the $2^6=64$ possible combinations as to how in each case two identical states A, B and C can be distributed among six memory cells.

DETAILED DESCRIPTION

The use of new memory technologies such as MRAM, RRAM or PCRAM affords cost advantages and improves compatibility with respect to the CMOS production process.

However, it is a challenge to cope with small read windows between the individual states, e.g. between 0-states and 1-states.

Figure 1:
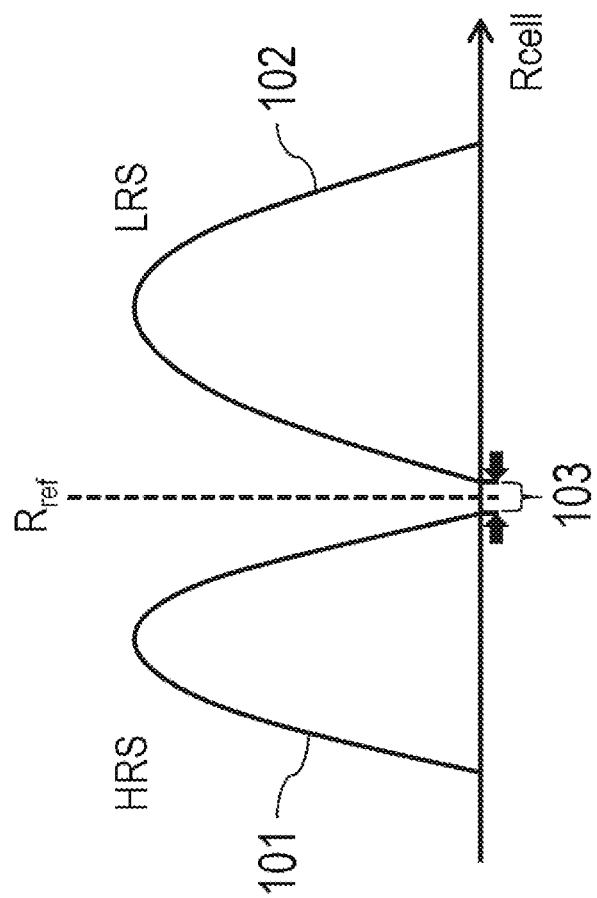
FIG. 1 shows an example diagram comprising two (frequency) distributions for cell resistances of memory cells.

FIG. 1 shows an example diagram comprising two (frequency) distributions 101 and 102 for cell resistances of memory cells, between which a read window 103 is located. The distribution 101 shows for example a high resistive state (HRS) and the distribution 102 correspondingly shows by way of example a low resistive state (LRS). By way of example, the HRS state can be assigned to a logic "1" and the LRS state can be assigned to a logic "0". The read window 103 is arranged around a reference value Rref.

Positioning of the reference value Rref for separating the two distributions 101 and 102 is problematic with regard to a high reliability and robustness of the differentiation of the states of the distributions 101 and 102. That is owing to the fact, firstly, that the available read window between the distributions is intended to be divided for the purpose of differentiation into logic 1 and logic 0. Secondly, the unambiguous differentiation between HRS and LRS is made more difficult by the fact that the memory alters its properties as a result of aging and/or under temperature influences: By way of example, the size and/or position of the read window 103 can change as a result. Moreover, it is possible as a result for the distributions 101 and 102 to approach or even overlap one another.

In order to alleviate this problem, complementary memory cells can be used. By way of example, two or a plurality of complementary memory cells can be used. In complementary memory cells, a data bit is represented by (at least) two physical memory cells, which have complementary states in the error-free case. By way of example, if two complementary memory cells A1 and A2 are used to represent a logic data bit, then the following can hold true:

A logic value "0" is present if the following holds true for the complementary memory cells A1 and A2: A1=0 and A2=1.

A logic value "1" is present if the following holds true for the complementary memory cells A1 and A2: A1=1 and A2=0.

In the error-free case, the two memory cells A1 and A2 thus always have complementary values: if the memory cell A1 carries the value 0, then the memory cell A2 carries the value 1, and vice versa.

Complementary memory cells can be used e.g. for arbitrary k-out-of-n codes. The example embodiment explained here describes an example implementation based on a 3-out-of-6 code. A code word of the 3-out-of-6 code has 6 bits (which correspond to physical states of the memory cells), of which 3 always have either the value 0 or the value 1 and the remaining 3 memory cells then have the value complementary thereto.

By way of example, 6 physical memory cells can be provided, which are utilized by means of a complementary approach for coding e.g. 4 bits.

FIG. 2 shows a table illustrating how 20 different states are represented on the basis of 6 memory cells Cell0 to Cell5. Each of the memory cells can assume a high resistive state (HRS) or a low resistive state (LRS). Each of the states corresponds to a value allocation of these 6 memory cells Cell0 to Cell5 and also to a code word of the 3-out-of-6 code.

For a k-out-of-n code it generally holds true that there are $$\binom{n}{k}$$

code words, each having k first values and (n−k) second values. The following holds true $$\binom{n}{k} = \frac{n!}{k! \cdot (n-k)!}$$

and thus for the 3-out-of-6 code $$\binom{6}{3} = \frac{6!}{3! \cdot (6-3)!} = \frac{6!}{3! \cdot 3!} = \frac{120}{6} = 20.$$

Thus, in the case of the 3-out-of-6 code, there are a total of 20 code words in which three bits have a first value and the other three bits have a second value. These code words can be used to map e.g. $2^4=16$ states (that is to say to code 4 bits), wherein 4 of the 20 code words remain unused for this.

Figure 3A:
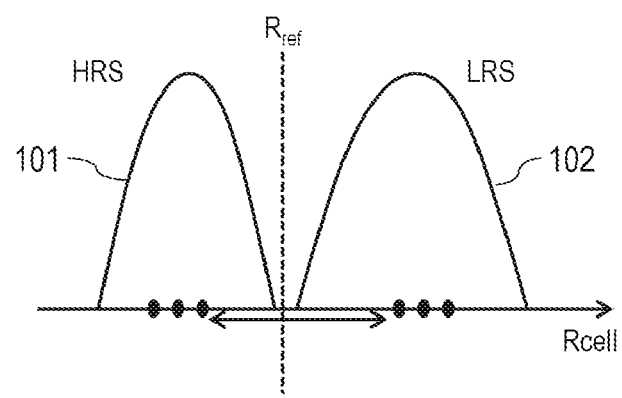
FIG. 3A shows an example diagram based on FIG. 1, wherein, in contrast to FIG. 1, resistance values Rcell of a total of 6 memory cells are depicted, wherein 3 memory cells have a low resistive state (LRS) and 3 memory cells have a high resistive state (HRS)

FIG. 3A shows an example diagram based on FIG. 1, wherein, in contrast to FIG. 1, resistance values Rcell of a total of 6 memory cells are depicted, wherein 3 memory cells have a low resistive state (LRS) and 3 memory cells have a high resistive state (HRS). As also in FIG. 1, the abscissa shows the resistance value Rcell of the respective cell.

Figure 3B:
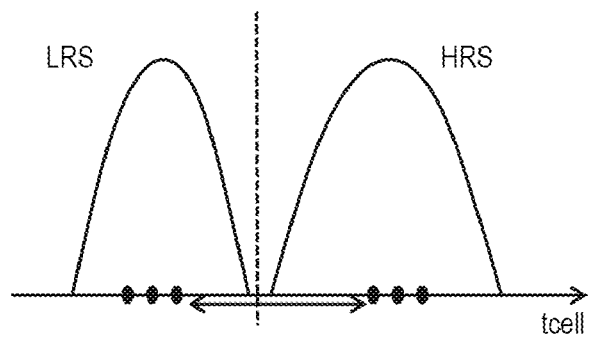
FIG. 3B shows an example diagram based on FIG. 3A after a transformation into the time domain.

FIG. 3B shows an example diagram based on FIG. 3A, wherein, in contrast to FIG. 3A, after a transformation into the time domain, the abscissa represents a time tcell. The determination of the individual states of the memory cells can accordingly take place in a time-dependent manner.

By way of example, the 0-state (e.g. the LRS) can be measured faster than the 1-state (e.g. the HRS): if, therefore, in accordance with the above example of the 3-out-of-6 code, the 0-state was determined three times, then, in the error-free case, it is already certain upon the determination of the third 0-state that the remaining three states that have not yet been determined must be 1-states. Consequently, the code word can already be determined prematurely as soon as just the three faster 0-states have been determined. There is no need to wait for the arrival of the slower 1-states.

It should be noted that it is assumed here by way of example that the 0-states on average can be determined before the 1-states. In principle, it suffices if a first state can be determined faster than a second state.

One example embodiment for determining three fastest 0-states is described for example in U.S. Pat. No. 9,805,771 B2, which also describe in detail how, proceeding from a hold signal determined by a logic, a multiplicity of latches (e.g. a latch can be realized as a D-type flip-flop, see e.g. https://de.wikipedia.org/wiki/Latch) are halted or the state of these latches is frozen. This mechanism of freezing the latches can also be realized for the present implementation.

FIG. 4 shows a diagram illustrating by way of example the temporal measurement of the states "0" and "1". Each of the memory cells 401 to 406 represents one of these two states. In the example shown in FIG. 4, the following allocation of the memory cells holds true by way of example:

Memory cell 401: State "1",
Memory cell 402: State "0",
Memory cell 403: State "1",
Memory cell 404: State "0",
Memory cell 405: State "0",
Memory cell 406: State "1".

As has already been explained, the 0-state corresponds for example to a low resistance value (LRS) in accordance with the distribution 102 and the 1-state then corresponds to a high resistance value (HRS) in accordance with the distribution 101. The transformation into the time domain has the result that the LRS "0" can be determined earlier than the HRS "1".

A memory cell in the 0-state (having the value 0) has a lower resistance value than a memory cell in the 1-state (having the value 1); therefore, a higher current flows through the memory cell having the value 0. If said current is integrated over time by means of a capacitance, a voltage results. This voltage rises more steeply with time and reaches a predefined threshold value significantly earlier than if the memory cell had the value 1 and accordingly was more highly resistive (and a lower current thus flowed for the same voltage). It follows from this that memory cells having the value 0 can be determined earlier in time than memory cells having the value 1.

Of course, the memory cell in its 1-state could also have the lower resistance value than the memory cell in its 0-state. In that case, the 1-state would be reached faster and the explanations would be correspondingly reversed. For the sake of clarity, it is assumed below that the memory cell in the 0-state has the lower resistance value.

The illustration chosen in FIG. 4 uses the analogy of a race in this sense, wherein the memory cell having the lowest resistance value (and thus the largest gradient of the voltage (=integrated current over time)) is the first to reach a finish line 407.

Accordingly, the measurement begins at a point in time t=t0 ("Start") and the first three 0-states for the memory cells 404, 402 and 405 were already able to be determined at a point in time t=t1 ("Finish line"). The other memory cells 401, 403 and 406 have not yet reached the finish line, i.e. have not yet reached the voltage threshold value by means of the integration described.

During the measurement, the temporal sequence in which the memory cells reached the finish line (that is to say the threshold value in the case of the integration of the current) is known; that being in the present case: firstly the memory cell 404, then the memory cell 402 and lastly the memory cell 405.

In the present example of the 3-out-of-6 code, exactly 3 of the 6 memory cells have the 0-state and the remaining three memory cells have the 1-state. Since the 0-state can be ascertained earlier than the 1-state, the measurement can be ended as soon as the third (and thus last) 0-state was able to be determined. This holds true under the assumption that the 0-states can actually be determined earlier than the 1-states.

Consequently, the finish line 407 subdivides the possible states of the memory cells 401 to 406 into two ranges, a range 408 for the 1-states and a range 409 for the 0-states. Distinctly more time would thus be required for the memory cells having the 1-state to reach the predefined voltage threshold value. These memory cells (the memory cells 401, 403 and 406 in the example in FIG. 4) have not yet reached the finish line 407 at the point in time t1, at which three 0-states have already been able to be determined. The third 0-state was able to be determined at this point in time t1. This is also the point in time at which the measurement can be ended and at which the states of the measurement amplifiers connected to the memory cells can be frozen. In the present example, three 0-states for the memory cells 404, 402 and 405 are present after freezing. The remaining three states for the memory cells 401, 403 and 406 are set to 1 in each case.

To summarize, the code word can thus be determined as soon as the first three states "0" are present. In the example shown in FIG. 4, the code word 101001 (LSB corresponds to the memory cell 406) can be determined at the time t1.

It is proposed below to combine a plurality of different k-out-of-n codes in order thus to create additional states, such that a total of 2m states are attained, for example, which can be represented by m bits, wherein it advantageously holds true that m is less than n.

Example 1

By way of example, it is proposed to combine the following k-out-of-n codes $$\binom{n}{k}$$

(code is also used as notation for this):
the $$\binom{6}{3}$$

code yields 20 states (code words);
the $$\binom{6}{1}$$

code yields 6 states (code words);
the $$\binom{6}{5}$$

code yields 6 states (code words).

Overall, therefore, this results in $$20+6+6=32=2^5$$

code words, which can be represented by m=5 bits. In this case, it is necessary to be able to distinguish efficiently the code words of the different codes from one another, i.e. the intention is to be able to determine efficiently whether a code word of the $$\binom{6}{3}$$

code, of the $$\binom{6}{1}$$

code or of the $$\binom{6}{5}$$

code is present. In other words, a plurality of different k-out-of-n codes (where a different value for k is used per code) can thus be combined in order to utilize as far as possible all 2m states which can be represented by m bits.

Example 2

In another example, the following k-out-of-n codes are combined:
the $$\binom{8}{4}$$

code yields 70 states (code words);
the $$\binom{8}{2}$$

code yields 28 states (code words);
the $$\binom{8}{6}$$

code yields 28 states (code words);
the $$\binom{8}{0}$$

code yields 1 state (code word);
the $$\binom{8}{8}$$

code yields 1 state (code word).
Overall, therefore, this results in $$70+28+28+1+1=128=2^7$$

code words, which can be represented by m=7 bits. In this example, too, n>m (8>7) once again holds true.

Example 1 is taken as a basis below, in which code words of the $$\binom{6}{3}$$

code, of the $$\binom{6}{1}$$

code and of the $$\binom{6}{5}$$

code are combined.

Figure 5:
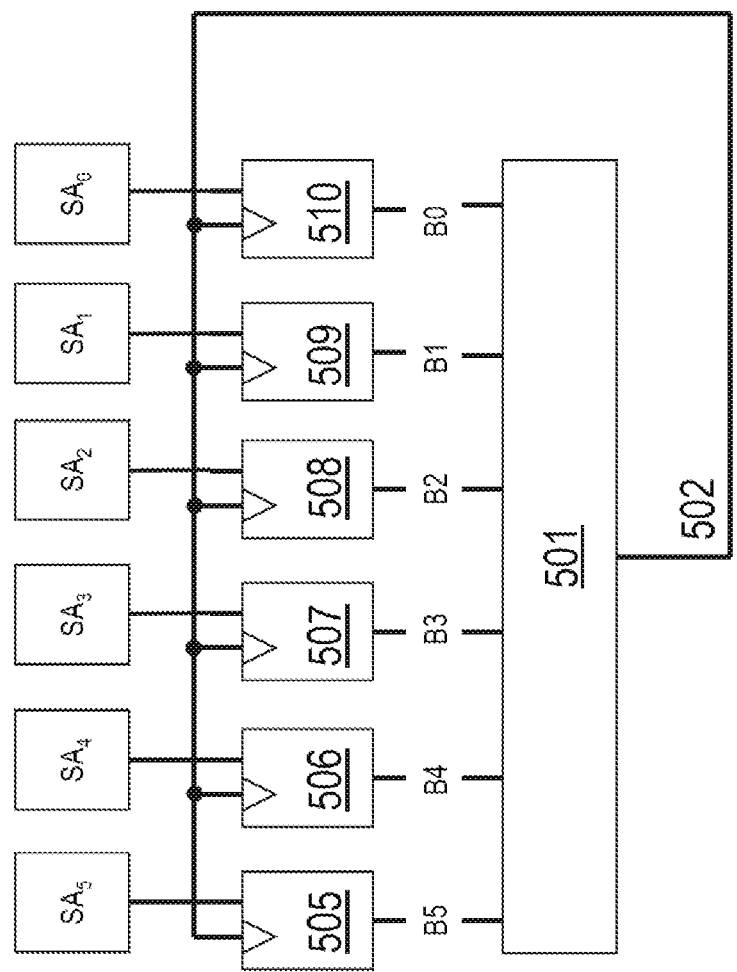
FIG. 5 shows an example circuit arrangement for detecting the k fastest states (bits) of a k-out-of-n code.

FIG. 5 shows an example circuit arrangement for detecting the k fastest states (bits) of a k-out-of-n code (it holds true here by way of example that k=3 and n=6).

Figure 6:
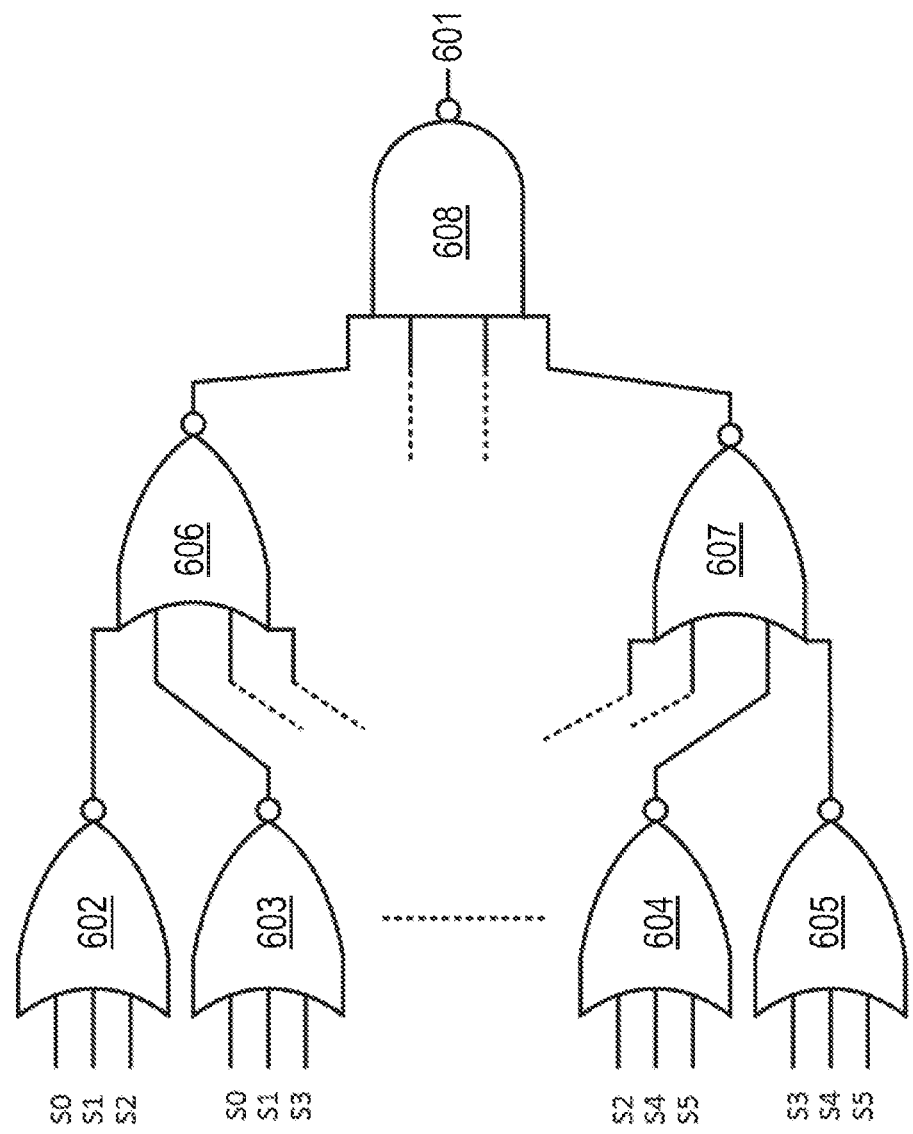
FIG. 6 shows an example realization of the block 501 from FIG. 5 as a logic circuit for determining the three fastest 0-states of a 3-out-of-6 code.

A block 501 comprises an associated logic circuit, which is explained in even greater detail below. By way of example, each logic circuit which enables the k fastest 0-states to be identified can be accommodated in the block 501. FIG. 6 describes how, at the point in time of the occurrence of the k fastest 0-states, all states can be frozen and thus registered by means of such a logic circuit.

Measurement amplifiers SA0 to SA5 supply states S0 to S5 of the memory cells of a memory. These states are fed to the block 501 via latches 505 to 510 (e.g. realized as D-type flip-flops). In the block 501, the k fastest 0-states are detected and the states of the latches 505 to 510 are then frozen ("latched") via a connection 502.

In the block 501, a hold signal (freeze signal) 502 is formed for the latches 505 to 510 and is passed to the inputs for inputting the hold signal of said latches 505 to 510. The state of a latch is frozen for example if the hold signal assumes the value 1.

As soon as an output signal of the block 501 thus switches over from 0 to 1 via the connection 502, the k fastest 0-states have been detected and the latches 505 to 510 are halted in such a way that the output signals provided by them no longer change. At this "frozen" point in time, therefore, the k fastest 0-states are present at the outputs of the latches 505 to 510. At the outputs of the latches 505 to 510, the states can be tapped off in the form of the bits B0 to B5 and processed further and/or stored.

FIG. 6 shows an example realization of the block 501 as a logic circuit. By way of example, the three fastest 0-states of a 3-out-of-6 code are determined here. An output signal 601 changes from 0 to 1 as soon as these three fastest 0-states have been determined.

The output signal 601 serves as a hold signal of the latches 505 to 510 and is determined on the basis of the six states S0 to S5 of the memory cells. In this case, each state is provided as a signal for a memory cell by the measurement amplifier (sense amplifier) SA0 to SA5, which initially assume the value "1", for example. Accordingly, the states S0 to S5 correspond to signals (0 or 1) of the 6 memory cells.

The states S0 to S5 are provided in the form of binary values.

In the case of the 3-out-of-6 code, after the third 0-state has arrived, it can be deduced that the remaining states have the value 1. Following this example, the circuit in accordance with FIG. 6 exhibits a logic for detecting the three fastest bits, which—as has been explained above—are 0-states (that is to say have the value 0). If the output signal 601 has the value 1, this indicates that the value 0 was identified three times at the outputs of the measurement amplifiers.

The circuit in accordance with FIG. 6 uses NOR gates by way of example for this purpose. A multiplicity of NOR gates are provided at the input, each of said gates having three inputs and an output. For each code word, three of the 6 states S0 to S5 always have the value 0, that is to say that the possible code words yield 20 combinations in which exactly one selection of three of the states S0 to S5 is equal to 0. These combinations correspond to the allocations of the inputs of the total of 20 NOR gates 602 to 605 (for the sake of clarity, not all 20 NOR gates are depicted, but rather only a selection of four NOR gates).

In this regard, by way of example, the inputs of the NOR gate 602 are connected to the states S0, S1 and S2. Correspondingly, the inputs of the NOR gate 603 are connected to the states S0, S1 and S3. Finally, the inputs of the NOR gate 604 are connected to the states S2, S4 and S5. The inputs of the NOR gate 605 are connected to the states S3, S4 and S5.

Consequently, each of these NOR gates 602 to 605 yields the value 1 at its output only if all of its inputs have the value 0.

The subsequent example implementation comprising five NOR gates 606 to 607 (each having four inputs) and one NAND gate 608 (having five inputs) corresponds to an ORing of the outputs of all the NOR gates 602 to 605 to form the output signal 601.

In this regard, in FIG. 6, by way of example, each output of one of the NOR gates 602 to 605 is connected to an input of one of the downstream NOR gates 606 to 607. The outputs of the NOR gates 606 to 607 are connected to the inputs of the NAND gate 608.

The output signal 601 has the value 1 only if three fastest bits have been identified. If three fastest bits have not yet been identified, then all the output signals of the NOR gates 602 to 605 have the value 0, the outputs of the NOR gates 606 to 607 are all 1 and the output signal 601 has the value 0. However, as soon as the value 0 is present at three of the six possible states S0 to S5, the relevant NOR gate 602 to 605, which maps exactly this combination of three at its inputs, switches from 0 to 1 at its output; the output of the relevant NOR gate 606 to 607 thus also switches from 1 to 0, as a result of which the output signal 601 of the NAND gate 608 toggles from 0 to 1.

Generally, the identification of the k fastest 0-states can be carried out by means of a circuit having in a first level a number of NOR gates which corresponds to the k-out-of-n possible combinations. In this case, each of the NOR gates has k inputs and each of the NOR gates maps at its inputs one of the k-out-of-n possible combinations in which k 0-states can occur. The outputs of the NOR gates are then logically ORed to form an output signal. By way of example, this logic ORing can be realized by a two-stage use of NOR gates and a NAND gate, as shown in FIG. 6. The output signal indicates with a value 1 that k 0-states are present. If the output signal has the value 0, at least k states have not yet occurred.

A plurality of such logic circuits can be used to determine different numbers k1, k2, etc. of 0-states. Whenever the output signal of the respective logic circuit has the value 1, the 0-states are registered. It is thus possible to determine which k1, k2, etc. 0-states occur or have occurred.

In accordance with the above example, the three fastest bits, the (one) fastest bit and the five fastest bits are thus intended to be detected. A circuit arrangement in accordance with FIGS. 5 and 6 described above can be used in each case for this purpose.

The state of the latches 505 to 510 in FIG. 5 is frozen once the outputs signal 502 of the block 501 has assumed the value 1. The output signal 502 assumes the value 1 with a time delay Δt, once the fastest three zeros are present at inputs of the latches 505 to 510 at a point in time t.

If the combinational circuit is realized as in FIG. 6, for example, said delay Δt is determined by the gate transit times of the logic gates.

In comparison with the point in time t, at which the three fastest zeros are present at three inputs of the latches 505 to 510, the values present at the inputs of the latches 505 to 510 are frozen only at the point in time t+Δt.

If a further zero, for example a fourth zero, is then present at one of the inputs of the latches 505 to 510 at the point in time t+Δt, then this fourth zero, too, is disadvantageously stored in one of the latches. Thus, as a result, erroneously, no code word of the 3-out-of-6 code is stored.

Consequently, on account of the time delay Δt, under certain conditions, it is not possible to differentiate the first three zeros from the first four zeros.

Examples that enable improved differentiability are shown below.

Figure 7:
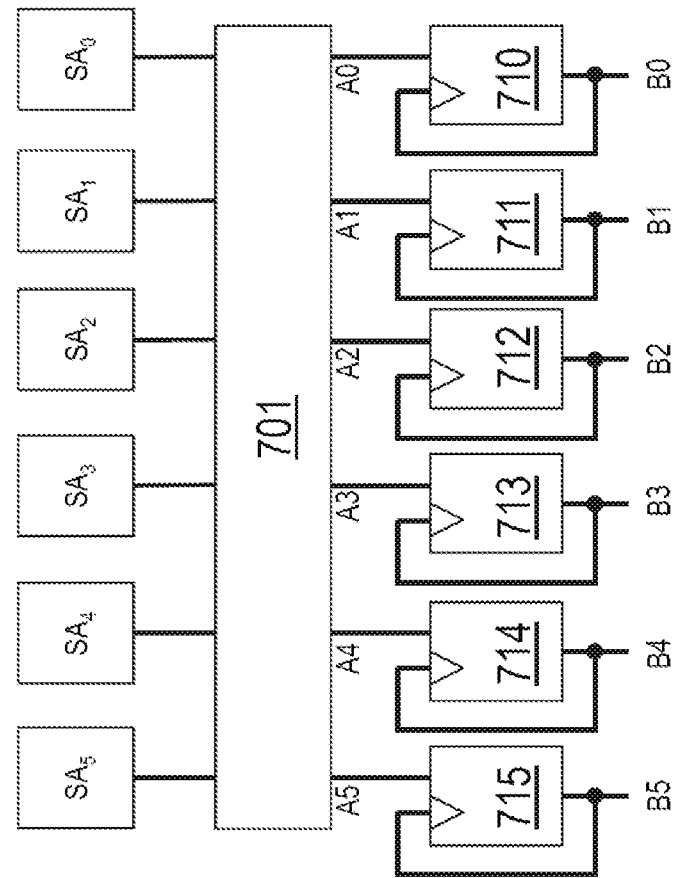
FIG. 7 shows an example realization of a so-called "prelogic"

FIG. 7 shows an example realization of a so-called "prelogic" in accordance with a circuit 701, which is connected directly to the outputs of the measurement amplifiers SA0 to SA5.

For this purpose, the circuit 701 comprises a combinational logic circuit, in particular, which, in accordance with the present example, provides a code word of a 3-out-of-6 code at its output only if a code word of the 3-out-of-6 code is also present at its input. By contrast, if no code word of the 3-out-of-6 code is present at the input of the circuit 701, then the circuit 701 provides at its output a predefined signal (e.g. as a predefined bit sequence), which itself is not a code word of the 3-out-of-6 code. The predefined signal is "000000", for example.

This approach has the advantage that the fastest three 0-values can be detected with the aid of the circuit 701 even if a further 0-value follows the third fastest 0-value with a very short delay. If a fourth 0-value is present at one of the inputs of the circuit 701, then the values 0 . . . 0 are output by the circuit 701.

This approach has the advantage that the fastest three 0-values can be detected (almost) without delay with the aid of the circuit 701. The output signal of the circuit 701 is "000000" in this example if one of the following conditions applies:

there are more than three 1-values (there are fewer than three 0-values), there are more than three 0-vlaues (i.e. there are fewer than three 1-values).

The latches 710 to 715 connected downstream correspondingly provide at their outputs the bits B0 to B5 in accordance with the signals provided by the circuit 701.

Figure 8:
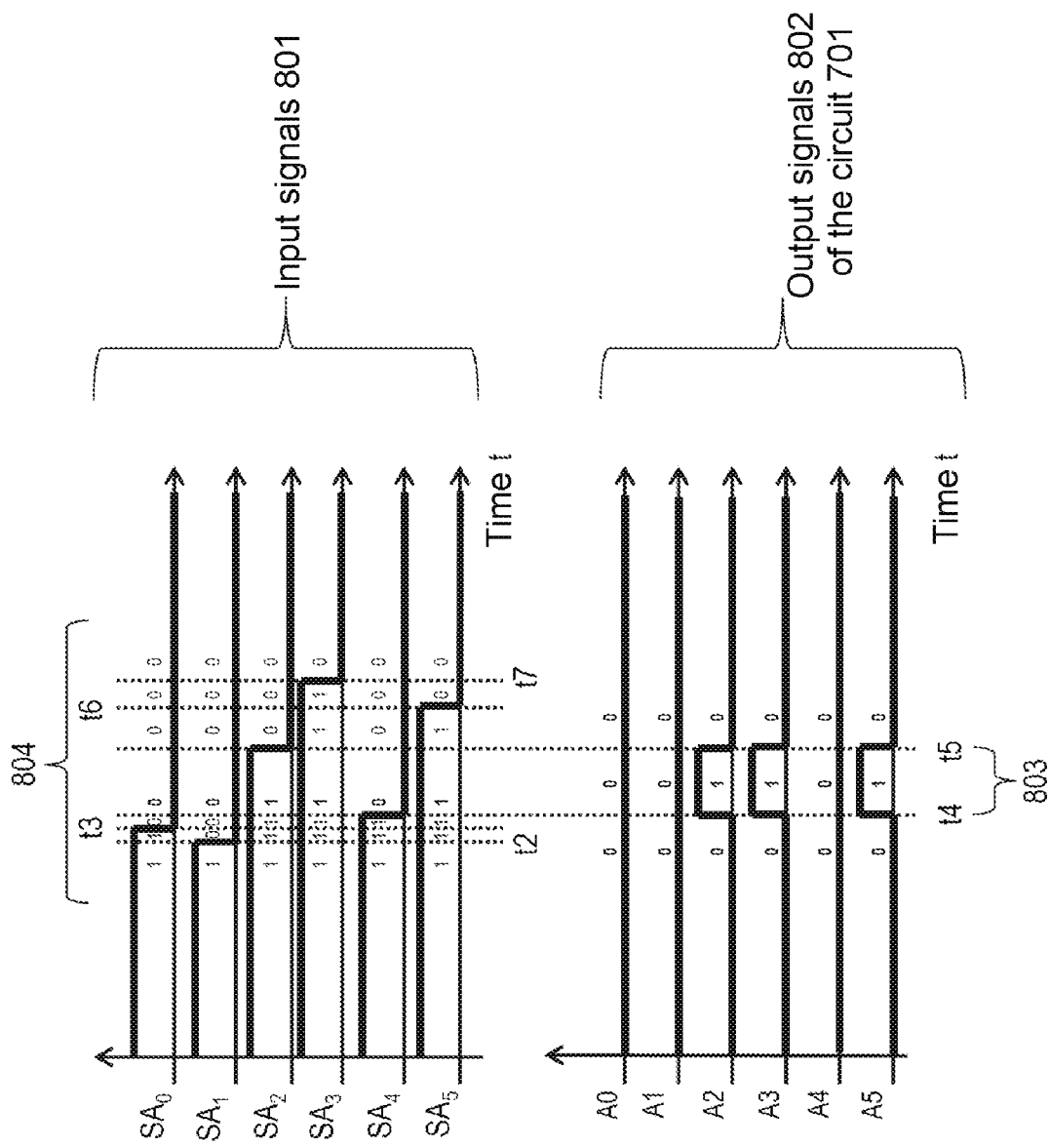
FIG. 8 shows two schematic diagrams illustrating a dependence between input signals present at the prelogic shown in FIG. 7 and output signals provided by said prelogic.

FIG. 8 shows two schematic diagrams showing a dependence between input signals 801 and output signals 802 of the circuit 701. The output signals 802 are present at the terminals A0 to A5 of the circuit 701 and the input signals 801 are supplied by the measurement amplifiers SA0 to SA5.

By way of example, the measurement amplifiers SA0 to SA5 supply the following values in a temporal sequence from t1 to t7:

|    | $SA_5$ | $SA_4$ | $SA_3$ | $SA_2$ | $SA_1$ | $SA_0$ |
|----|--------|--------|--------|--------|--------|--------|
| t1 | 1 | 1 | 1 | 1 | 1 | 1 |
| t2 | 1 | 1 | 1 | 1 | 0 | 1 |
| t3 | 1 | 1 | 1 | 1 | 0 | 0 |
| t4 | 1 | 0 | 1 | 1 | 0 | 0 |
| t5 | 1 | 0 | 1 | 0 | 0 | 0 |
| t6 | 0 | 0 | 1 | 0 | 0 | 0 |
| t7 | 0 | 0 | 0 | 0 | 0 | 0 |

Consequently, the 1-values initially predefined deterministically in this example gradually toggle to the value 0. During a time duration 803, the values 101100 (in the order A5 ... A0), that is to say a code word of the 3-out-of-6 code, are present as output signal at the terminals A0 to A5. For all other values, the output signal is 000000. The circuit 701 can comprise a DNF logic (in this respect, see further below), which assigns the input signals coming from the measurement amplifiers SA0 to SA5 correspondingly to the terminals A0 to A5. For this purpose, the circuit 701 can comprise a multiplicity of logic gates or an assignment table (lookup-table).

The arrangement of latches 710 to 715 ensures that the three fastest 0-states in this example, which are output by way of example as 1-values at the terminals A0 to A5, are provided as the bits B0 to B5 permanently during a read process.

It should be noted that the input signals 801 are input signals of a memory area having for example 6 memory cells which are accessed by read access. After the read process requiring a time duration 804, for example, the latches 710 to 715 are reset again, such that a new read process can be carried out.

Accordingly, a plurality of prelogic circuits can be provided, which e.g. in parallel effect read access to the same memory cells and detect different code words.

Figure 12:
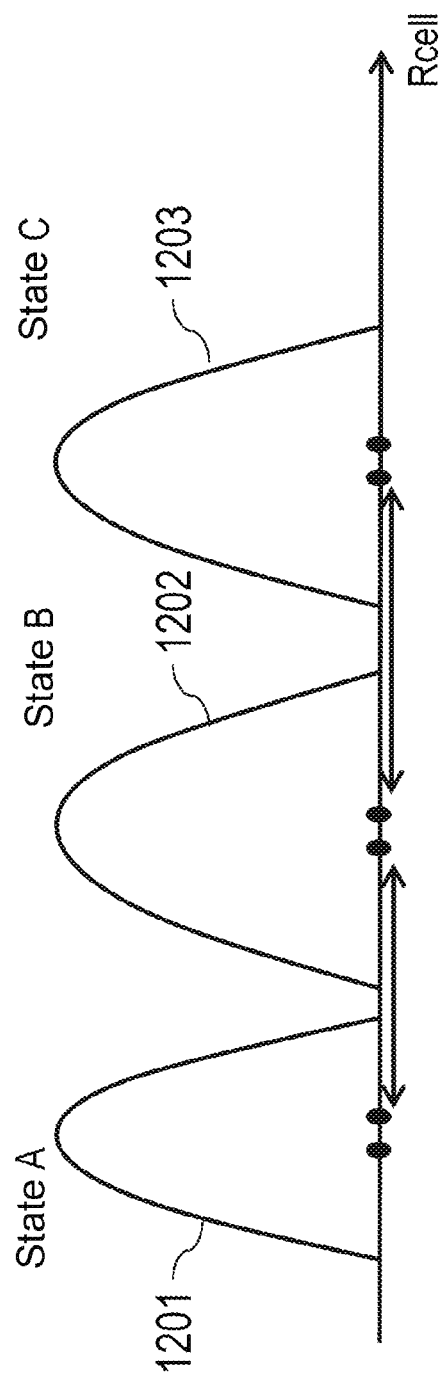
FIG. 12 shows an example diagram with three different distributions versus the resistance value Rcell of the memory cell, wherein each of the distributions represents a state of the individual memory cell.

In line with FIG. 3A, FIG. 12 shows an example diagram with three different distributions 1201, 1202 and 1203 versus the resistance value Rcell of the memory cell, wherein each of the distributions represents a state of the individual memory cell. Accordingly, three possible states A, B and C arise in the example in FIG. 12. Consequently, after the read process of a memory cell, it is thus possible to determine whether the latter is in the state A, B or C. If six memory cells are read, for example, this results in an arbitrary sequence of six such states.

In this respect, FIG. 12 thus represents an extension vis-à-vis FIG. 3A in such a way that more than two states per memory cell can be differentiated.

This approach can be extended correspondingly to more than three states per memory cell.

Figure 9:
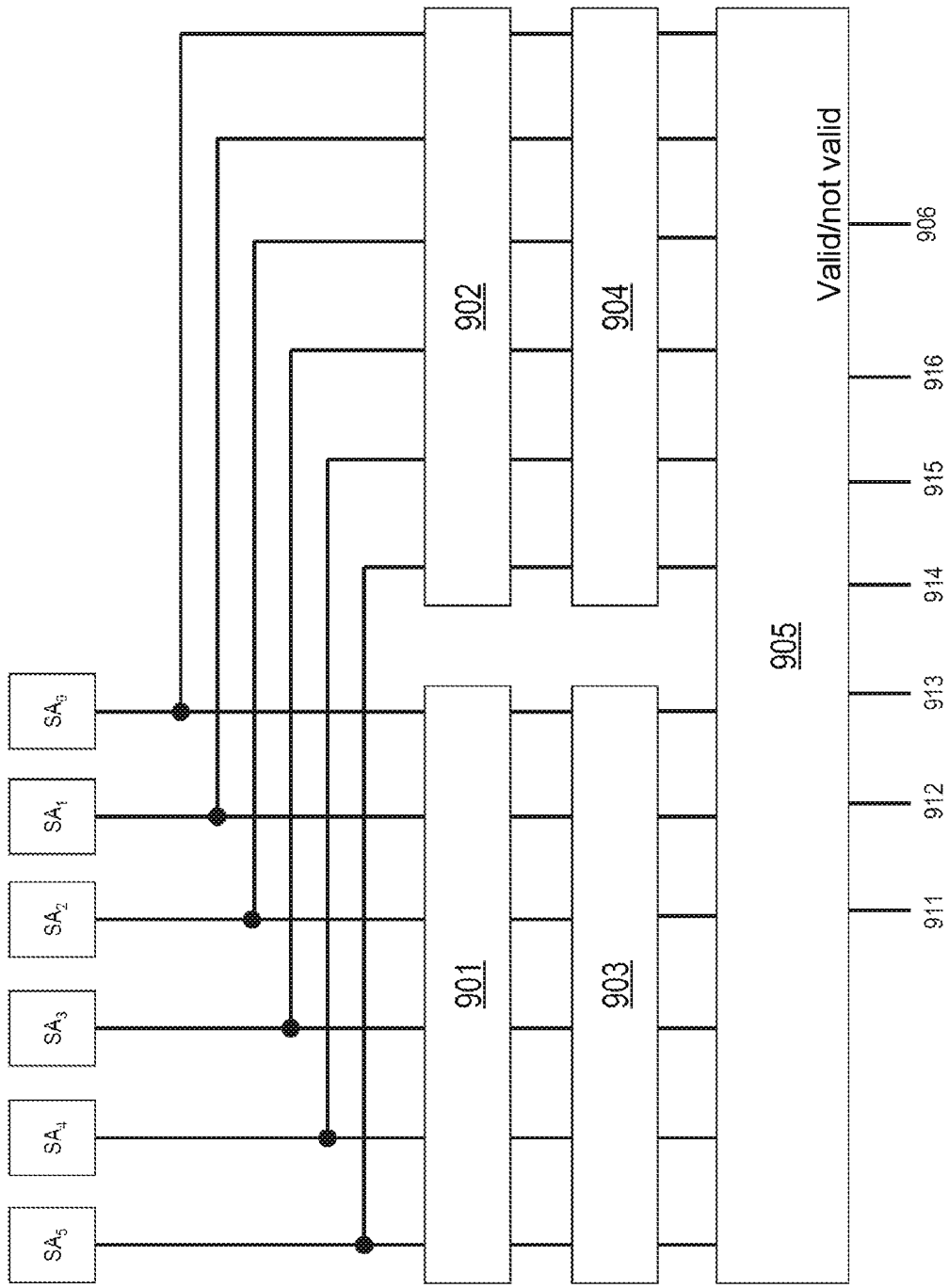
FIG. 9 shows an example in which the values supplied by the measurement amplifiers are passed to two prelogics.

FIG. 9 shows an example in which each of the values supplied by the measurement amplifiers SA0 to SA5 can have one of the three states A, B or C.

By way of example, a code shall be assumed in which in each case 2 of the 6 memory cells have the same state A, B and C. There is a total of 90 possibilities for distributing respectively two states A, respectively two states B and respectively two states C among six places.

Said 90 possibilities thus represent 90 possible code words of the code used here by way of example having the ternary components A, B and C, wherein a 6-component code word has two components having the value A, two components having the value B and two components having the value C. In this case, A, B and C can each assume one of three different values.

Consequently, there are various possibilities for coding for example 64 bit combinations, corresponding to 6-bit values, as code words with 90 code words.

Consequently, the 90 code words can be assigned to the 26=64 possible (binary) bit combinations in various ways.

In FIG. 9, the values supplied by the measurement amplifiers SA0 to SA5 are passed to two circuits 901 and 902. The circuit 901 is a prelogic which determines the positions of the two fastest cells (i.e. of those memory cells which have the state A with the smallest cell resistance Rcell), and the circuit 902 is a prelogic which determines the positions of the four fastest cells (i.e. of those memory cells which have the state A and the state B, wherein the state B as described is characterized in that the affected cells have the second smallest cell resistance Rcell). Two memory cells remain, which can automatically be allocated the state C.

In accordance with the illustration in FIG. 12, the state C corresponds to those two memory cells which have the largest cell resistances Rcell.

An arrangement of latches 903 is disposed downstream of the circuit 901, said arrangement storing the two fastest 0-values.

Correspondingly, an arrangement of latches 904 is disposed downstream of the circuit 902, said arrangement storing the fastest four 0-values.

It should be noted that two individual fastest 0-values necessitate that the remaining four values be logic 1. Furthermore, the detection of four 0-values means that two 1-values are furthermore present. Consequently, the states A, B and C, as described above, can be differentiated from one another.

A logic circuit 905 determines the allocation of the six memory cells by means of the two fastest 0-values (at the output of the arrangement of latches 903) and the fastest four 0-values (at the output of the arrangement of latches 904). Said allocation can be output correspondingly directly or in the form of a further coding at outputs 911 to 916 of the logic circuit 905. Furthermore, the logic circuit 905 has an output 906 used to indicate whether or not the values present at the outputs 911 to 916 are valid. By way of example, the output 906 can have the value 0 if the values at the outputs 911 to 916 are invalid. The output 906 correspondingly has the value 1 if the values at the outputs 911 to 916 are valid.

The table below shows by way of example, on the basis of the values provided by the measurement amplifiers SA0 to SA5, the values at the outputs of the arrangements 903 and 904 and the values at the output of the logic circuit 905:

| Time | Values at the output of the measurement amplifiers SA5 to SA0 | Values at the output of the arrangement 903 | Values at the output of the arrangement 904 | Values at the output of the logic circuit 905 | Values at the output 906 |
| --- | --- | --- | --- | --- | --- |
| t1 | 111111 | 000000 | 000000 | DC | invalid |
| t2 | 111101 | 000000 | 000000 | DC | invalid |
| t3 | 111100 | 111100 | 000000 | DC | invalid |
| t4 | 101100 | 111100 | 000000 | DC | invalid |
| t5 | 101000 | 111100 | 101000 | 010001 (CBCBAA) | valid |
| t6 | 001000 | 111100 | 101000 | 010001 (CBCBAA) | valid |
| t7 | 000000 | 111100 | 101000 | 010001 (CBCBAA) | valid |

The values at the output of the logic circuit 905 are invalid at the points in time t1 to t4 (this is indicated by "DC" standing for "don't care") and are valid starting from the point in time t5. Consequently, by means of the output 906, it is possible to decide whether or when a valid signal is present at the outputs 911 to 916 and can accordingly be processed further.

It should be noted here that the value supplied by the measurement amplifier SA0 corresponds to the least significant bit (LSB).

The following sequence of 0-values results from the second column of the table above:
 at the bit position 1 at the time t2,
 at the bit position 0 at the time t3,
 at the bit position 4 at the time t4,
 at the bit position 2 at the time t5,
 at the bit position 5 at the time t6 and at the bit position 3 at the time t7.

Starting from the time t3, the first two 0-values are identified at the bit positions 0 and 1 and the signal 111100 (having two 0-values) is present at the output of the arrangement of latches 903.

Starting from the time t5, the first four 0-values are identified at the bit positions 0, 1, 4 and 2 and the signal 101000 (having four 0-values) is present at the output of the arrangement of latches 904.

At the same time, which two bit positions are the slowest bit positions is determined unambiguously (in the example the bit positions 5 and 3, which still have 1-values at the time t5).

It is thus possible for the logic circuit 905 to determine a signal CBCBAA already starting from the point in time t5, as is shown in FIG. 13.

By way of example, 64 possible allocations of 6 bits can be mapped onto 64 of the 90 code words possible in total (see explanations above), as is shown in FIG. 14. The remaining 90−64=26 code words are not used in this case. Those 26 code words which are not intended to be utilized can be selected arbitrarily or according to a specific predefinition.

In accordance with the table shown in FIG. 14, the bit combination 010001, corresponding here for example to the signal CBCBAA mentioned above, is thus provided at the outputs of the logic circuit 905.

Figure 10:
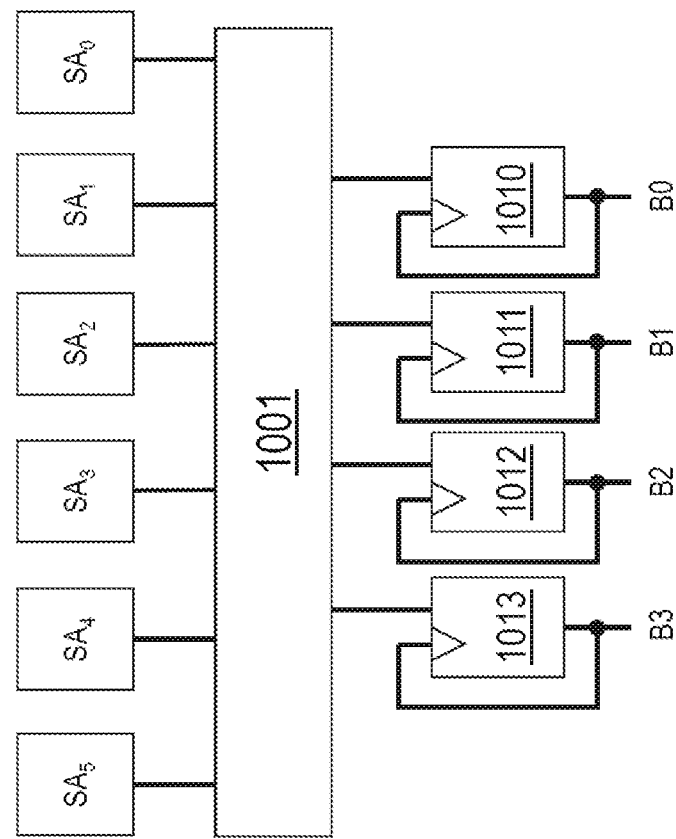
FIG. 10 shows an alternative embodiment to the prelogic shown in FIG. 7.

FIG. 10 shows an alternative embodiment to FIG. 7, in which a circuit 1001 is provided as prelogic, said circuit being directly connected to the outputs of the measurement amplifiers SA0 to SA5.

The circuit 1001 comprises a combinational logic circuit, which, in accordance with the present example, transforms a code word e.g. of a 3-out-of-6 code into a predefined bit sequence—4 bits in the present example. The latches 1010 to 1013 connected downstream then provide the corresponding bits B0 to B3 at their outputs.

One example transformation of the input signals present at the circuit 1001 into the bits B0 to B3 could be implemented as follows:

| | Values at the output of the measurement amplifiers $SA_0$ to $SA_5$ ($SA_0$ corresponds to the least significant bit): $SA_5 \ldots SA_0$ | Values of the bits B0 to B3 (B0 is the least significant bit): $B3 \ldots B0$ |
|---|---|---|
| 1 | 000111 | 0000 |
| 2 | 001011 | 0001 |
| 3 | 010011 | 0010 |
| 4 | 100011 | 0011 |
| 5 | 001101 | 0100 |
| 6 | 010101 | 0101 |
| 7 | 100101 | 0110 |
| 8 | 011001 | 0111 |
| 9 | 101001 | 1000 |
| 10 | 110001 | 1001 |
| 11 | 001110 | 1010 |
| 12 | 010110 | 1011 |
| 13 | 100110 | 1100 |
| 14 | 011010 | 1101 |
| 15 | 101010 | 1110 |
| 16 | 110010 | 1111 |
| 17 | 011100 | 0000 |
| 18 | 101100 | 0000 |
| 19 | 110100 | 0000 |
| 20 | 111000 | 0000 |
| | Other | 0000 |

There are 20 code words of the 3-out-of-6 code. Only 16 code words thereof can be assigned to different 4-bit values. Four code words of the 3-out-of-6 code remain for which no 4-bit value not yet used exists (rows 17 to 20 in the table above). For these 4 code words of the 3-out-of-6 code and for all other bit combinations at the input of the circuit 1001, the transformation yields the bit sequence 0000 as output signal.

Optionally, the circuit 1001 can also be extended in such a way that at least one additional parity bit is provided: by way of example, a parity bit "0" can be added in the case of an odd number of 1-values, and otherwise a parity bit "1".

Each of the circuits provided as prelogic here can be implemented in such a way that the transformation that is to be carried out by the prelogic is implemented by means of a table or some other specification. Moreover, a logic circuit can implement the transformation by virtue of the transformation specification being realized by means of a disjunctive normal form (DNF) on the basis of gates (AND, OR, NOR gates) (see e.g. https://de.wikipedia.org/wiki/Disjunktive_Normalform).

By way of example, it is evident from the table above that the output bit B0 (here as LSB on the far right) has the value 1 if the outputs of the measurement amplifiers assume the values shown in rows 2, 4, 6, 8, 10, 12, 14 or 16. Accordingly, the allocations shown in said rows are ORed in accordance with the DNF as follows:

$$B0 = (\neg x5 \wedge \neg x4 \wedge x3 \wedge \neg x2 \wedge x1 \wedge x0) \vee \\ (x5 \wedge \neg x4 \wedge \neg x3 \wedge \neg x2 \wedge x1 \wedge x0) \vee \\ (\neg x5 \wedge x4 \wedge \neg x3 \wedge x2 \wedge \neg x1 \wedge x0) \vee \\ (\neg x5 \wedge x4 \wedge x3 \wedge \neg x2 \wedge \neg x1 \wedge x0) \vee \\ (x5 \wedge x4 \wedge \neg x3 \wedge \neg x2 \wedge \neg x1 \wedge x0) \vee \\ (\neg x5 \wedge x4 \wedge \neg x3 \wedge x2 \wedge x1 \wedge \neg x0) \vee \\ (\neg x5 \wedge x4 \wedge x3 \wedge \neg x2 \wedge x1 \wedge \neg x0) \vee \\ (x5 \wedge x4 \wedge \neg x3 \wedge \neg x2 \wedge x1 \wedge \neg x0),$$

wherein x0 corresponds to that input of the circuit 1001 which is connected to the measurement amplifier SA0, x1 corresponds to that input of the circuit 1001 which is connected to the measurement amplifier SA1, x2 corresponds to that input of the circuit 1001 which is connected to the measurement amplifier SA2, x3 corresponds to that input of the circuit 1001 which is connected to the measurement amplifier SA3, x4 corresponds to that input of the circuit 1001 which is connected to the measurement amplifier SA4, x5 corresponds to that input of the circuit 1001 which is connected to the measurement amplifier SA5.

This can accordingly be carried out correspondingly for the remaining bits B1 to B3. As a result, four Boolean equations defining the values of the bits B0 to B3 on the basis of the input values x0 to x5 are thus obtained. These relationships can be implemented in a simple manner by means of gate circuits.

Example system implementation and further advantages

Figure 11:
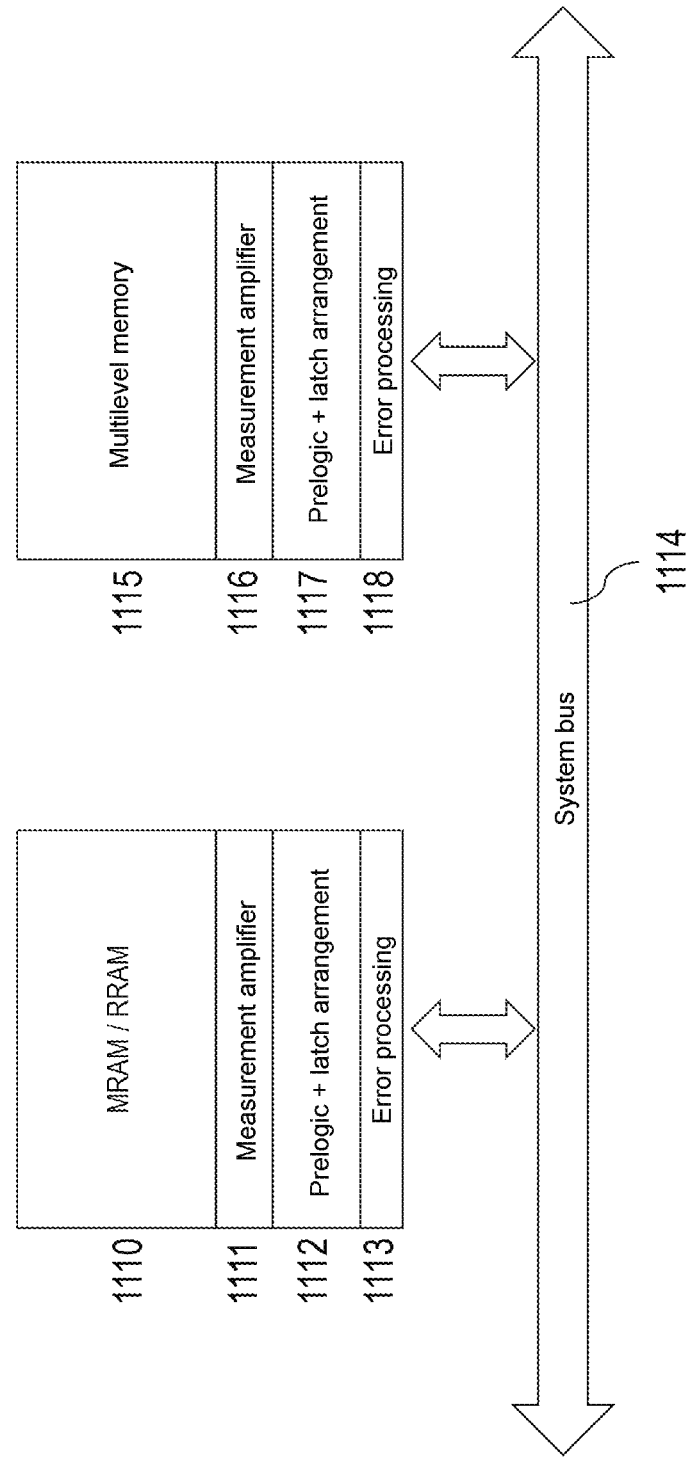
FIG. 11 shows an example system implementation for different memories.

FIG. 11 shows an example system implementation for an MRAM, PCRAM and/or RRAM 1110 comprising a multiplicity of memory cells. The values stored in the memory cells are read out via measurement amplifier 1111 and an assignment of the memory cells to logic (0− or 1−) states is effected with the aid of the prelogic with latch arrangement 1112 as described here (see e.g. FIG. 7). What is achieved by the realization by means of prelogic with latch arrangement is that there is no need for any additional downstream and possibly delaying logic as shown in FIG. 5. The transformation of cell states tapped off at the outputs of the measurement amplifiers into data bits is effected directly and before the storage of the transformed bits in the latches. This advantageously reduces the number of latches required and thus the area required on the chip.

The prelogic with latch arrangement 1112 is coupled to a system bus 1114 via an error processing 1113.

The error processing 1113 can use an error code, for example. The error code can be an error detecting code that has check bits formed from the bits from different groups of n bits. In one embodiment, the check bits are formed by means of a bit-group-correcting code. The error processing 1113 can comprise, as explained, error detection and/or error correction.

One option is to realize the error handling for the bits from groups of n bits and to use a byte-error-correcting and/or byte-error-detecting code, for example a known Reed-Solomon code.

A further option is to realize the error handling for the bits of the bit groups and to use a bit-error-correcting and/or bit-error-detecting code.

In addition, a multilevel memory 1115 can be coupled via measurement amplifier 1116 to a prelogic with latch arrangement 1117, which supplies bits to an error processing 1118. The error processing 1118 is in turn coupled to the system bus 1114.

The measurement amplifier can access the memory in each case in groups of n bits. A bit sequence read from n memory cells in each case can thus be processed further as a group of n bits. In the error-free case, each of the bit sequences represents a code word of a k-out-of-n code. By way of example, n can be equal to 6 or equal to 8.

Although the disclosure has been more specifically illustrated and described in detail by means of the at least one example embodiment shown, nevertheless the disclosure is not restricted thereto and other variations can be derived therefrom by the person skilled in the art, without departing from the scope of protection of the disclosure.

The invention claimed is:

1. A method for transforming binary signals read from a memory, comprising:
    transforming a first binary signal into a second binary signal in response to determining that the first binary signal is a predefined code word of a k-out-of-n code, wherein n and k are positive integers and n>k, and
    transforming a third binary signal into a predefined signal in response to determining that the third binary signal is not a predefined code word of the k-out-of-n code,
    wherein the predefined signal is different than the second binary signal and indicates that the third binary signal is not a predefined code word of the k-out-of-n code.

2. The method as claimed in claim 1, wherein the first binary signal is read from n memory cells of the memory.

3. The method as claimed in claim 2, wherein a memory cell of the memory is configured to assume two or more states.

4. The method as claimed in claim 1, wherein the predefined signal comprises at least one of:
    a predefined bit sequence,
    a predefined bit sequence having a validity signal, in particular a validity bit, and
    a predefined bit sequence having a same number of digits as the second binary signal.

5. The method as claimed in claim 1,
    wherein the first binary signal has n binary values,
    wherein the second binary signal has a number of binary values which is less than or equal to n.

6. The method as claimed in claim 1, wherein the second binary signal or the predefined signal is stored in an arrangement of latches, wherein a number of latches corresponds to a number of binary values of the second binary signal.

7. The method as claimed in claim 1,
    wherein the first binary signal and the second binary signal each have n binary values.

8. The method as claimed in claim 1,
    wherein n states are read from memory cells of a memory,
    wherein k fastest states or (n–k) fastest states of the first binary signal are determined in a time domain.

9. The method as claimed in claim 8, wherein the k fastest states or the (n–k) fastest states are 0-states.

10. The method as claimed in claim 9, wherein remaining states that do not belong to the k fastest states or the (n–k) fastest states are correspondingly set as 1-states.

11. The method as claimed in claim 1, wherein the memory comprises at least one of:
    Floating gate cells;
    PCRAM,
    RRAM,
    MRAM,
    MONOS components,
    Nanocrystal cells, and
    ROM.

12. A device comprising a processing circuit configured to:
    determine that a first binary signal, which is n bits in length and which has a first n-bit pattern, matches an n-bit pattern of a predefined code word, wherein the predefined code word is one of a predetermined number of predefined code words of a k-out-of-n code, wherein n and k are positive integers and n>k, wherein each predefined code word is n-bits in length and has a different n-bit pattern from that of the other respective predefined code words of the predetermined number of predefined code words;
    provide a second binary signal based on the first binary signal in response to determining that the first binary signal matches the n-bit pattern of the predefined code word;
    determine that a third binary signal, which is n bits in length and which has a third n-bit pattern, differs from each n-bit pattern of the predetermined number of predefined code words; and
    provide a predefined signal in response to determining that the third binary signal differs from each n-bit pattern of the predetermined number of predefined code words,
    wherein the predefined signal is different than the second binary signal.

13. A non-transitory computer-readable storage medium, comprising computer-executable instructions that upon execution cause a computer to perform acts, comprising:
    transforming a first binary signal into a second binary signal in response to determining that the first binary signal is a predefined code word of a k-out-of-n code, wherein n and k are positive integers and n>k, and
    transforming a third binary signal into a predefined signal in response to determining that the third binary signal is not a predefined code word of the k-out-of-n code,
    wherein the predefined signal is different than the second binary signal and indicates that the third binary signal is not a predefined codeword of the k-out-of-n code.

14. The method as claimed in claim 1, wherein each predefined code word of the k-out-of-n code has a total of n bits, wherein k bits of each predefined code word of the k-out-of-n code have a first binary value, and wherein n minus k bits of each predefined code word of the k-out-of-n code have a second binary value, opposite the first binary value.

15. The method as claimed in claim 1, wherein the first binary signal is transformed into the second binary signal at a first time and the third binary signal is transformed into the predefined signal at a second time, different from the first time.

16. The device as claimed in claim 12, further comprising:
an arrangement of latches,
wherein the second binary signal or the predefined signal is stored in the arrangement of latches, wherein a number of latches corresponds to a number of binary values of the second binary signal.

17. The device as claimed in claim 12, wherein the second binary signal is provided to be identical to the first binary signal in response to determining that the first binary signal matches the n-bit pattern of the predefined code word.

18. The device as claimed in claim 12, wherein k bits of each code word of the k-out-of-n code have a first binary value, and wherein n minus k bits of each code word of the k-out-of-n code have a second binary value, opposite the first binary value.

* * * * *